United States Patent
Yap et al.

(10) Patent No.: US 7,078,809 B2
(45) Date of Patent: Jul. 18, 2006

(54) CHEMICAL LEADFRAME ROUGHENING PROCESS AND RESULTING LEADFRAME AND INTEGRATED CIRCUIT PACKAGE

(75) Inventors: Yoon Foong Yap, Penang (MY); Moses Moh Shu Chee, Penang (MY)

(73) Assignee: Dynacraft Industries Sdn. Bhd., Penang (MY)

( * ) Notice: Subject to any disclaimer, the term of this patent is extended or adjusted under 35 U.S.C. 154(b) by 0 days.

(21) Appl. No.: 10/941,412

(22) Filed: Sep. 15, 2004

(65) Prior Publication Data

US 2005/0139968 A1 Jun. 30, 2005

(30) Foreign Application Priority Data

Dec. 31, 2003 (MY) .............................. PI 20035052

(51) Int. Cl.
*H01L 23/48* (2006.01)
*B32B 3/24* (2006.01)
*H05K 1/09* (2006.01)

(52) U.S. Cl. ...................... 257/739; 257/766; 257/787; 428/612; 174/257; 174/259

(58) Field of Classification Search ............... 428/209, 428/612; 257/739, 766, 787; 174/257, 259
See application file for complete search history.

(56) References Cited

U.S. PATENT DOCUMENTS

| | | | |
|---|---|---|---|
| 4,767,049 A | 8/1988 | Butt et al. | 228/111 |
| 4,948,707 A | 8/1990 | Johnson et al. | 430/11 |
| 5,310,580 A | 5/1994 | O'Sullivan et al. | 427/307 |
| 5,449,951 A | 9/1995 | Parthasarathi et al. | 257/677 |
| 5,869,130 A | 2/1999 | Ferrier | 427/98 |
| 6,099,939 A | 8/2000 | Mittal et al. | 428/161 |
| 6,284,309 B1 | 9/2001 | Bishop et al. | 427/98 |
| 6,525,406 B1 | 2/2003 | Chung et al. | 257/666 |
| 6,562,149 B1 | 5/2003 | Grieser | 148/270 |
| 6,570,099 B1 * | 5/2003 | Hirano et al. | 174/258 |
| 6,602,803 B1 | 8/2003 | Yew | 438/780 |

* cited by examiner

*Primary Examiner*—Cathy F. Lam
(74) *Attorney, Agent, or Firm*—BainwoodHuang

(57) ABSTRACT

A chemical leadframe roughening process includes cleaning and chemically micro-etching a raw copper leadframe to remove organic material and oxide material from the surface. The surface of the leadframe is then roughened using an organic and peroxide solution, resulting in a finely pitted surface morphology. The roughened leadframe is cleaned to remove organic material, and then is plated with a lead-free plating material (such as a layered plating of nickel-palladium-gold (NiPdAu)) having a reflow temperature higher than the reflow temperature of lead-based solder. The plated leadframe exhibits the desired finely pitted morphology that is believed to provide for greater bonding with the mold compound used to make a finished integrated circuit package, thereby improving the moisture sensitivity level (MSL) performance of the package.

4 Claims, 4 Drawing Sheets

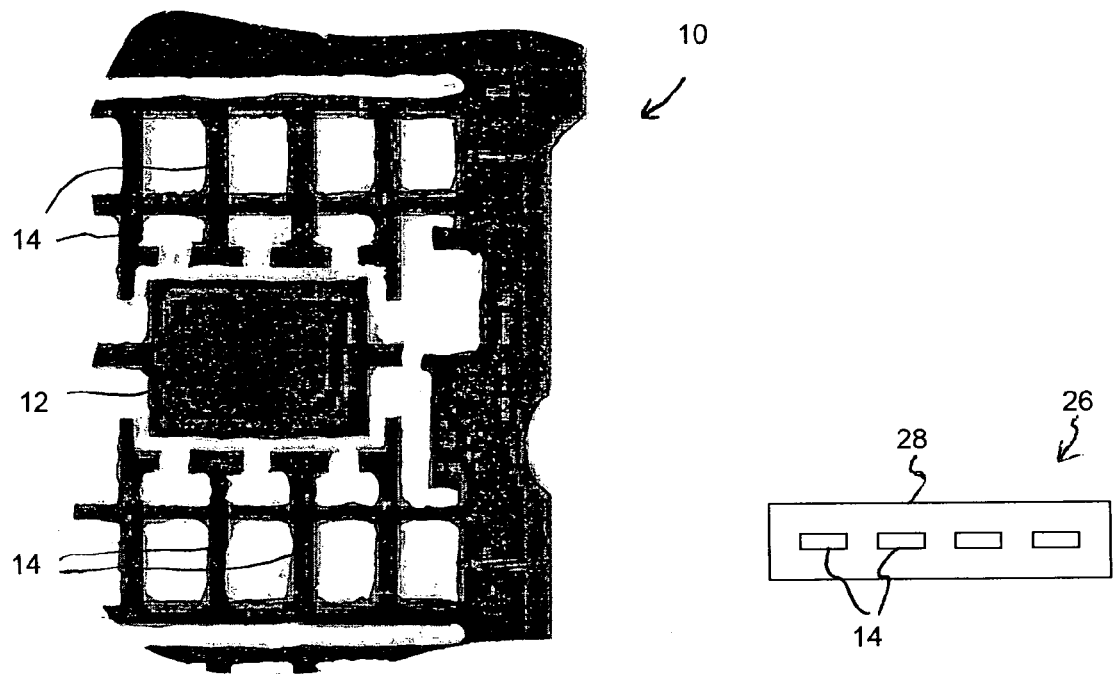
Figure 7
Figure 1 (prior art)
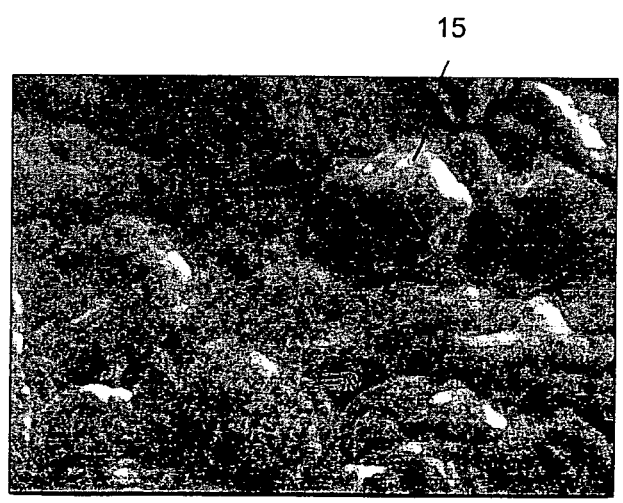
Figure 2 (prior art)

|  | Clean | Micro-etch | Activate | Micro-Roughen | Remove Organics |
|---|---|---|---|---|---|
| Chem. 1 | Moldprep LF Cleaner 175-225 ml/l | Descabase 10-20 g/l | Moldprep LF Activator 20-25 ml/l | Moldprep Part A 225-275 ml/l | Descabase DM 40-50 g/l |
| Chem. 2 |  | Sulfuric Acid 4-6% v/v |  | Moldprep Part B 25-30 ml/l | Sulfuric Acid 13-16% v/v |
| Chem. 3 |  |  |  | Moldprep Starter 20 ml/l |  |
| Temp. | 50-70 C. | Room Temp. | 35-45 C | 35-45 C | Room Temp. |
| pH | n/a | n/a | 5-8 | n/a | n/a |
| Duration | 48 s | 48 s | 33 s | 48 s | 33 s |
| Cu PPM Control | <500 ppm | <1500 ppm | n/a | <5000 ppm | <5000 ppm |

Figure 4

CHEMICAL LEADFRAME ROUGHENING PROCESS AND RESULTING LEADFRAME AND INTEGRATED CIRCUIT PACKAGE

BACKGROUND OF THE INVENTION

The present invention relates to the field of leadframes used in packaging integrated circuits.

One important aspect of packaged integrated circuits (ICs) is their so-called Moisture Sensitivity Level or MSL, which reflects the degree to which the ICs resist moisture-induced stresses that can cause failure. The MSL of a packaged IC depends in part on the quality of the seal at the interface between the plastic encapsulating mold compound and the metallic leads that extend from the package.

The electronics industry is moving towards the use of lead-free plating materials for plating IC leadframes. Combinations such as nickel-palladium-gold (NiPdAu) are replacing current tin-lead (SnPb) solders. A typical configuration has an Ni layer having a thickness between 0.5 and 1.4 microns, followed by a Pd layer having thickness between 0.02 to 0.10 microns and an Au layer of thickness between 0.003 and 0.010 microns. However, with the higher reflow temperature (260 C for NiPdAu vs. 235 C for SnPb), along with relatively poor mold compound adhesion to the Au component, it is expected that MSL performance for NiPdAu-plated leadframes will be reduced by at least one or two levels compared to standard Ag/Cu leadframes.

It would be desirable to improve the MSL performance of leadframes plated with lead-free plating materials, such as NiPdAu-plated leadframes.

BRIEF SUMMARY OF THE INVENTION

In accordance with the present invention, a chemical leadframe roughening process is disclosed that enhances the bonding of leadframes to the mold compounds used in making plastic IC packages, thereby improving the moisture sensitivity level (MSL) performance of IC packages employing leadframes plated with lead-free plating materials, such as NiPdAu-plated leadframes.

The process includes cleaning and chemically microetching a raw leadframe to remove organic material and oxide material from the surface. In an illustrated embodiment, the raw leadframe is made of a copper alloy, and thus the cleaning and micro-etching solutions are of the type that are effective to treat copper surfaces.

The surface of the cleaned and micro-etched leadframe is then roughened using an organic and peroxide solution. In particular, the roughening creates a finely pitted morphology on the surface of the leadframe in contrast to a coarser "peaks and valleys" morphology created by prior art processes.

The roughened leadframe is then cleaned to remove organic material from the surface, and the cleaned leadframe is plated with lead-free plating material(s) having a reflow temperature higher than the reflow temperature of lead-based solder. Examples of such materials include the aforementioned NiPdAu. The plated leadframe still exhibits the desired finely pitted morphology that is believed to provide for greater bonding with the mold compound when the leadframe is subsequently incorporated into a finished IC package.

Other aspects, features, and advantages of the present invention will be apparent from the Detailed Description that follows.

BRIEF DESCRIPTION OF THE SEVERAL VIEWS OF THE DRAWINGS

FIG. 1 is a planar view of a leadframe as known in the art;

FIG. 2 is a microphotograph of a surface of the leadframe of FIG. 1 after a surface roughening process known in the art;

FIG. 4 is a table showing details of the process of FIG. 3;

FIG. 7 is an edge view of a complete integrated circuit package including the leadframe of FIG. 6 and a plastic encapsulant.

DETAILED DESCRIPTION OF THE INVENTION

FIG. 1 shows a portion 10 of a leadframe used in packaging semiconductor integrated circuits (ICs). As is known in the art, leadframes are formed from a thin sheet metal such as copper by a stamping and/or etching process. The leadframe portion 10 includes a die pad 12 surrounded by leads 14 to be used in packaging a single IC.

As mentioned above, it is known to perform a surface roughening process on a leadframe to enhance the bonding of the mold compound, especially in the vicinity of the leads 14 that extend outwardly from the package. FIG. 2 shows the surface morphology of the leadframe obtained using a standard process in the industry. It will be observed that the features include "peaks" and "valleys" disposed in a generally continuous manner. Individual grains such as grain 15 are on the order of 5 microns wide. Although this standard process and the resulting morphology have been shown to provide sufficiently low moisture sensitivity when utilized with standard lead-based soldering schemes, its MSL performance degrades when employed with modern plating materials such as NiPdAu, due in part to the higher reflow temperature of such materials. This performance degradation is avoided by use of the disclosed surface roughening technique.

Figure 3:
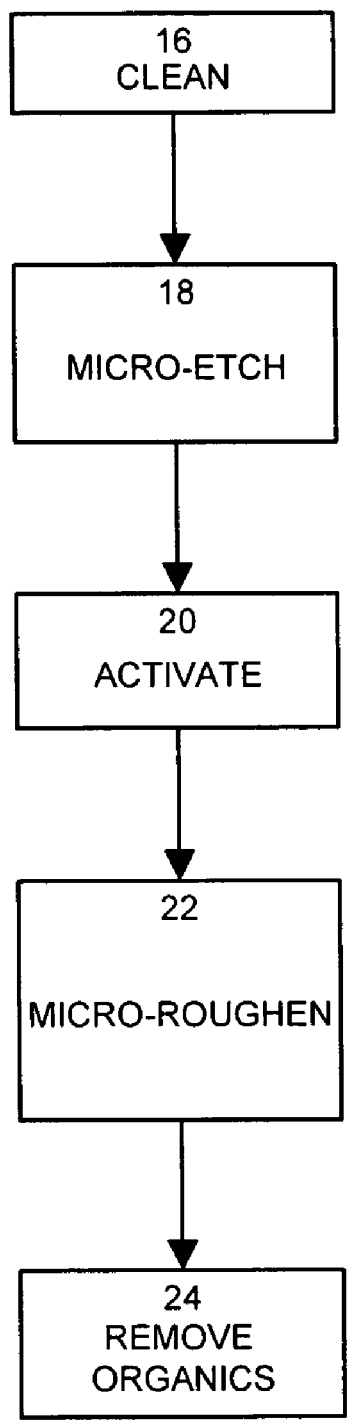
FIG. 3 is a flow diagram of a chemical surface roughening process applied to the leadframe of FIG. 1 in accordance with the present invention.

In general, the manufacturing of leadframes according to the disclosed technique proceeds as follows. As is known in the industry, these steps can be performed in a quasi-continuous fashion on reel-based leadframe stock. In one embodiment, processing can be performed at speeds on the order of 5 feet per minute:

1. Create raw leadframe (Stamp/Etch)
2. Surface roughening
3. NiPdAu plating
4. Cut & downset FIG. 3 illustrates step #2, surface roughening, from the list above. The sub-steps shown in FIG. 3 are further described with reference to FIG. 4, which shows specific chemical treatments and process parameters used in the roughening process.

In step 16, the leadframe is cleaned with an alkaline cleaner to remove dirt and oil. As shown in FIG. 4, a preferred alkaline cleaner is known by the trade name "Moldprep LF Cleaner", and is used in a concentration of 175–225 ml/l. Moldprep LF Cleaner is available from Atotech Deutschland GmbH. Cleaning with Moldprep LF Cleaner is preferably done at a temperature of 50–70 C for a duration of about 48 seconds. It is also preferable that the cleaning solution be free of copper to less than 500 PPM. To accomplish this latter objective, the cleaning bath can be monitored for copper concentration and replaced with fresh cleaning solution when the copper concentration reaches 500 PPM.

In step 18, the leadframe surface is micro-etched with an acidic etchant to remove copper oxide. This step employs an etchant solution known by the trade name Descabase (also available from Atotech Deutschland GmbH) at a concentration of 10–20 g/l, along with sulfuric acid at a concentration of 4–6% by volume. The step is conducted at room temperature for about 48 seconds, and the copper concentration in the etchant solution must be kept to less than 1,500 PPM.

In step 20, the leadframe is exposed to an activator solution known by the trade name Moldprep LF Activator at a concentration of 20–25 ml/l. This step is carried out at 35–45 C for about 33 seconds. The pH of the solution should be maintained in the range of 5 to 8. There is no requirement for controlling the copper concentration of the solution.

In step 22, the surface is roughened using an organic solvent in a sulfuric acid base. A preferred solution includes Moldprep Part A at 225–275 ml/l (organic material), Moldprep Part B at 25–30 ml/l (hydrogen peroxide base copper etchant), and Moldprep Starter at 20 ml/l (an additive used as a complexing agent). This step is also done at 35–45 C, for a duration of about 48 seconds. Copper concentration should be kept below 5,000 PPM, either through regular dumping and replacement with fresh solution or by using a continuous bleed-and-feed system.

Finally, in step 24, organic substances remaining after the roughening step 22 are removed. A preferred solution includes an acid-based organic remover known as Descabase DM (40–50 g/l) and sulfuric acid 13–16% by volume. This step is conducted at room temperature for about 33 seconds. Copper concentration should be kept below 5,000 PPM.

In addition to the Descabase/Moldprep brands of chemical solutions from Atotech, there are other collections of solutions that may be employed. These include solutions sold under the trade names Co-Bra Bond, Multi-bond, Alphaprep, Sealbond, and Circubond.

Figure 5:
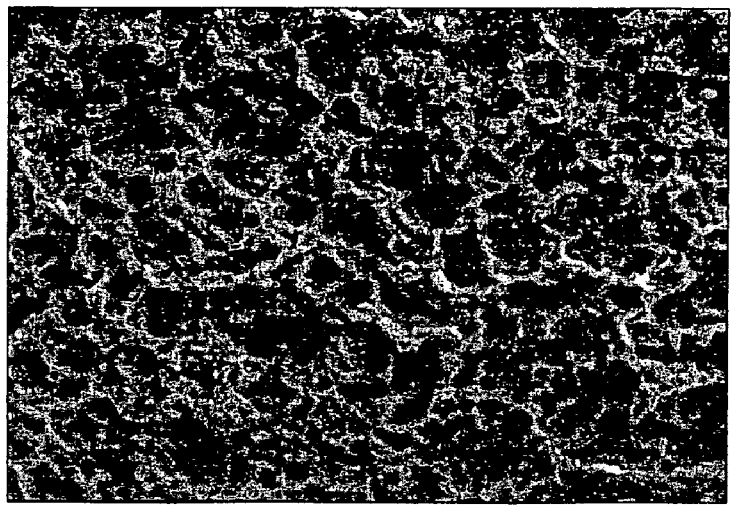
FIGS. 5 and 6 are microphotographs of a surface of the leadframe of FIG. 1 after the chemical surface roughening process of FIGS. 3 and 4.
Figure 6:
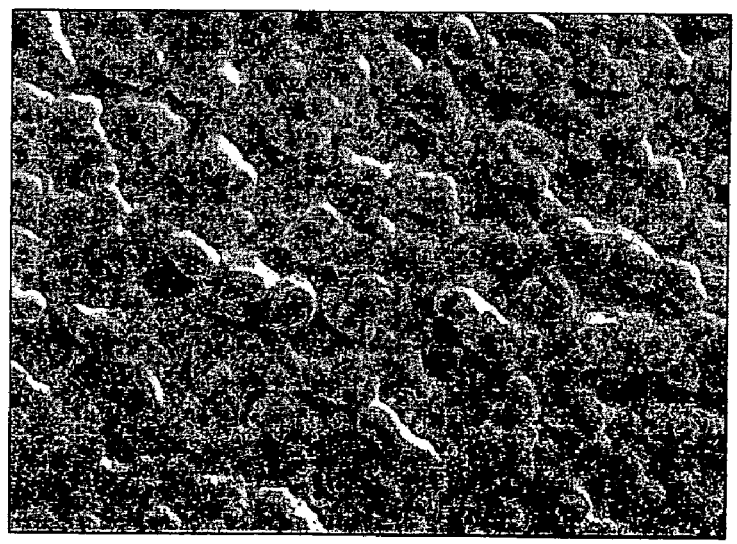

FIG. 5 shows the morphology of the raw copper leadframe after the processing of FIGS. 3 and 4. In contrast to the "peaks and valleys" morphology of the prior art, the morphology yielded by the disclosed process has more of a "pits and tunnels" or finely pitted characteristic. Additionally, the feature sizes are substantially smaller, on the order of 5–20 nm. versus the 5-micron grain size in the prior art. FIG. 6 shows the morphology of the roughened leadframe after being plated with NiPdAu (same level of magnification). It will observed that the "pits and tunnel" characteristic is maintained to a significant extent. It is believed that this morphology is responsible for improving the bonding of the mold compound to the plated leadframe.

FIG. 7 shows a side view of a completely packaged IC 26, which includes the leads 14 of the leadframe surrounded by hardened plastic mold compound 28. The mold compound 28 is a thermoset type of plastic compound of the type commonly used in the semiconductor packaging industry, and may be classified for example as novolac, anhydride, biphenyl, or multi aromatic resin. The disclosed technique can improve the moisture sensitivity in packages made of any of these mold compounds.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A plated leadframe for use in an integrated circuit package, comprising a surface-roughened raw leadframe with a plating applied thereto, the roughened surface of the raw leadframe having a finely pitted morphology, and the plating comprising a lead-free plating material having a reflow temperature higher than the reflow temperature of lead-based solder, wherein the roughened surface of the raw leadframe has a surface roughness in the range from 5 to 20 nm.

2. A plated leadframe according to claim 1, wherein the lead-free plating material comprises nickel, palladium and gold.

3. A packaged integrated circuit, comprising:
   a plastic encapsulating body; and plated conductive leads extending from the body, each lead including a surface-roughened raw lead with a plating applied thereto, the roughened surface of the raw leads having a finely pitted morphology, and the plating comprising a lead-free plating material having a reflow temperature higher than the reflow temperature of lead-based solder, wherein the roughened surface of the raw leads has a surface roughness in the range from 5to 20nm.

4. A packaged integrated circuit according to claim 3, wherein the lead-free plating material comprises nickel, palladium and gold.

* * * * *